(12) United States Patent
Chun et al.

(10) Patent No.: US 9,299,457 B2
(45) Date of Patent: Mar. 29, 2016

(54) KERNEL MASKING OF DRAM DEFECTS

(71) Applicant: QUALCOMM INCORPORATED, San Diego, CA (US)

(72) Inventors: Dexter T. Chun, San Diego, CA (US); Yanru Li, San Diego, CA (US); Xiangyu Dong, San Diego, CA (US); Jungwon Suh, San Diego, CA (US); Jung Pill Kim, San Diego, CA (US); Deepti Vijayalakshmi Sriramagiri, San Diego, CA (US)

(73) Assignee: QUALCOMM INCORPORATED, San Diego, CA (US)

(*) Notice: Subject to any disclaimer, the term of this patent is extended or adjusted under 35 U.S.C. 154(b) by 102 days.

(21) Appl. No.: 14/187,279

(22) Filed: Feb. 23, 2014

(65) Prior Publication Data
US 2015/0243373 A1  Aug. 27, 2015

(51) Int. Cl.
G11C 29/00 (2006.01)
G11C 29/44 (2006.01)
G06F 11/10 (2006.01)
G06F 11/20 (2006.01)
G06F 12/02 (2006.01)

(52) U.S. Cl.
CPC ............ *G11C 29/44* (2013.01); *G06F 11/1048* (2013.01); *G06F 11/1076* (2013.01); *G06F 11/2053* (2013.01); *G06F 12/0246* (2013.01); *G06F 2212/7209* (2013.01); *G11C 2029/4402* (2013.01)

(58) Field of Classification Search
None
See application file for complete search history.

(56) References Cited

U.S. PATENT DOCUMENTS

| 5,263,032 A | 11/1993 | Porter et al. |
| 5,343,426 A | 8/1994 | Cassidy et al. |
| 2006/0161759 A1* | 7/2006 | Hillier, III ........... G06F 12/0284 711/202 |
| 2008/0316822 A1* | 12/2008 | Ahn ..................... G06F 11/1068 365/185.09 |
| 2009/0055680 A1 | 2/2009 | Honda et al. |
| 2009/0282300 A1 | 11/2009 | Heyrman et al. |
| 2010/0332894 A1 | 12/2010 | Bowers et al. |
| 2010/0332895 A1 | 12/2010 | Billing et al. |
| 2012/0265921 A1* | 10/2012 | Post .................... G06F 12/0638 711/103 |
| 2012/0324299 A1 | 12/2012 | Moshayedi |
| 2013/0246891 A1 | 9/2013 | Manning et al. |

(Continued)

FOREIGN PATENT DOCUMENTS

WO       2013115783 A1     8/2013

OTHER PUBLICATIONS

Curtis Wickman et al., Cost Models for Large File Memory DRAMs with ECC and Bad Block Marking, University of Alberta Edmonton, Canada, 1999.
International Search Report and Written Opinion—PCT/US2015/016913—ISA/EPO—May 11, 2015.

*Primary Examiner* — Daniel McMahon
(74) *Attorney, Agent, or Firm* — Smith Risley Tempel Santos LLC

(57) ABSTRACT

Systems, methods, and computer programs are disclosed for kernel masking dynamic random access memory (DRAM) defects. One such method comprises: detecting and correcting a single-bit error associated with a physical address in a dynamic random access memory (DRAM); receiving error data associated with the physical address from the DRAM; storing the received error data in a failed address table located in a non-volatile memory; and retiring a kernel page corresponding to the physical address if a number of errors associated with the physical address exceeds an error count threshold.

36 Claims, 8 Drawing Sheets

(56) References Cited

U.S. PATENT DOCUMENTS

| | | |
|---|---|---|
| 2013/0275836 A1 | 10/2013 | Inada et al. |
| 2013/0326293 A1 | 12/2013 | Muralimanohar et al. |
| 2015/0039848 A1* | 2/2015 | Chun .................... G06F 3/0617 711/202 |
| 2015/0127972 A1* | 5/2015 | Chun .................. G06F 11/1008 714/6.13 |

* cited by examiner

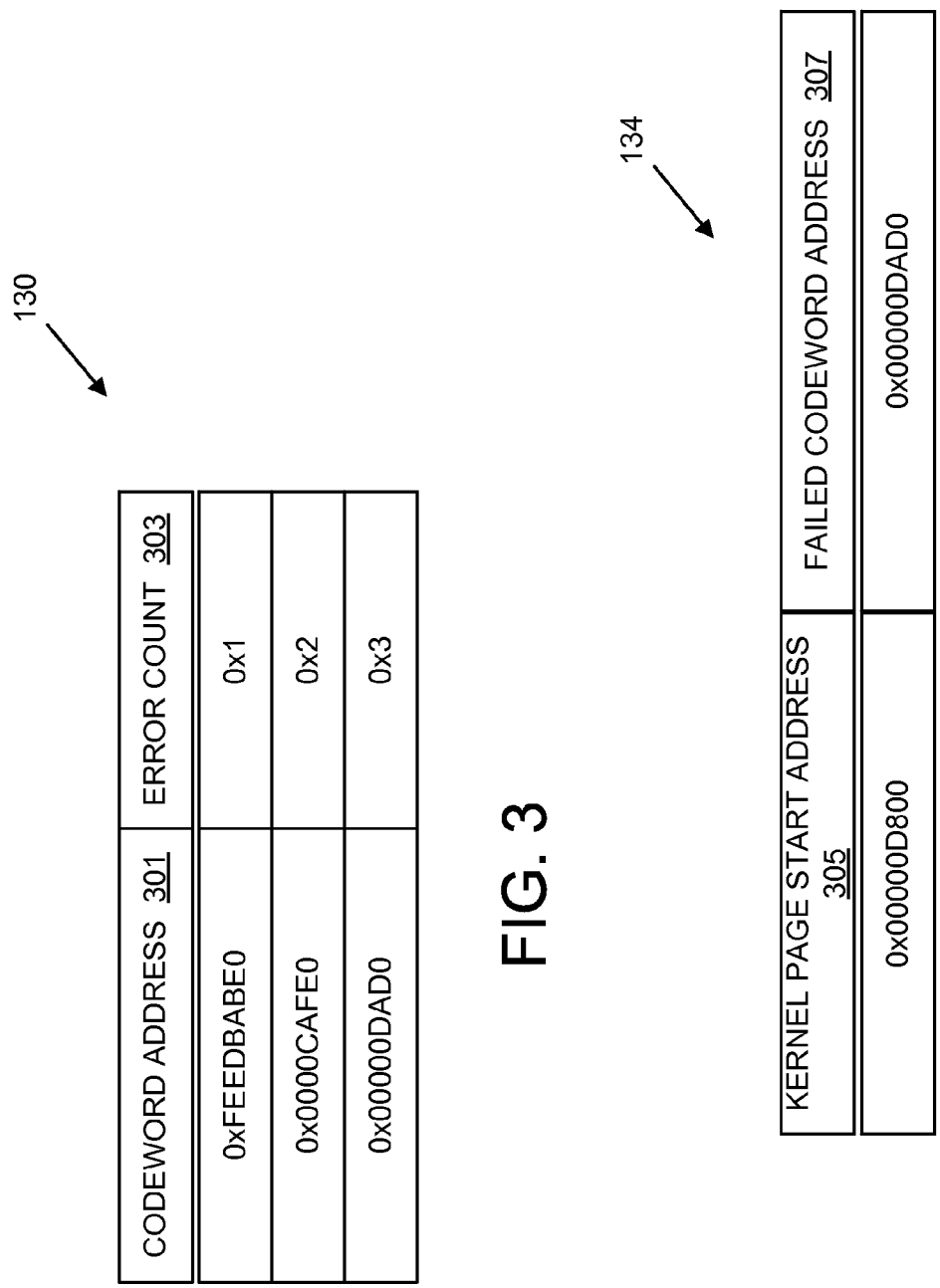

KERNEL MASKING OF DRAM DEFECTS

DESCRIPTION OF THE RELATED ART

Dynamic random access memory (DRAM) manufacturing process technology continues to scale down to accommodate increasing demands for greater memory capacity in smaller chips. The common measure of DRAM process technology is half-pitch, which refers to half the distance between cells in a DRAM chip. Current DRAM process technology produces DRAM chips with a half-pitch in the range of 20-30 nanometer (nm), although it is expected that improvements in process technology will scale down to less than 20 nm in the near future.

While denser DRAM chips provide desirable performance and design advantages, the shrinking geometry produces many challenges. For example, as DRAM process technology continues to scale down, there will be a proportionate decrease in cell capacitance, which increases cell transistor leakage. The normal distribution of cell retention across the DRAM die will not tighten, and overall it will continue to exhibit "tails" with some cells having a significant variance in cell retention compared to the mean. Reliably maintaining data in these "tails" may either require a significant increase in the frequency of refresh or, alternatively, an error recovery scheme, such as, block error correction. Block error correction may be required along with refresh to read-correct-write the data stored in the DRAM. In the latter case, wear over the lifetime of the device may lead to an accumulation of errors. Correcting multiple simultaneous errors on a DRAM requires significant silicon area. Furthermore, increasing the frequency of refresh adversely impacts the available memory bandwidth and also raises the standby power consumption.

Accordingly, there is a need for improved systems and methods that provide a cost-effective and efficient way to address the problem of defective DRAM cells, particularly as DRAM process technology continues to scale down.

SUMMARY OF THE DISCLOSURE

Systems, methods, and computer programs are disclosed for kernel masking dynamic random access memory (DRAM) defects. One such method comprises: detecting and correcting a single-bit error associated with a physical address in a dynamic random access memory (DRAM); receiving error data associated with the physical address from the DRAM; storing the received error data in a failed address table located in a non-volatile memory; and retiring a kernel page corresponding to the physical address if a number of errors associated with the physical address exceeds an error count threshold.

Another embodiment is a system for masking dynamic random access memory (DRAM) defects. One such system comprises dynamic random access memory (DRAM) system, an error correcting code (ECC) module, and a central processing unit (CPU). The ECC module detects and corrects bit errors associated with failed codeword addresses in the DRAM. The CPU executes an operating system comprising a bad page masking module. The bad page masking module comprises logic configured to: receive, via one or more of the DRAM system and the ECC module, error data associated with the failed codeword addresses; store the received error data in a failed codeword address table located in a non-volatile memory; and retire kernel pages corresponding to the failed codeword address if a number of errors associated with the respective failed codeword address exceeds an error count threshold.

BRIEF DESCRIPTION OF THE DRAWINGS

In the Figures, like reference numerals refer to like parts throughout the various views unless otherwise indicated. For reference numerals with letter character designations such as "102A" or "102B", the letter character designations may differentiate two like parts or elements present in the same Figure. Letter character designations for reference numerals may be omitted when it is intended that a reference numeral to encompass all parts having the same reference numeral in all Figures.

FIG. 3 is a data diagram illustrating an embodiment of a failed codeword address table for implementing certain aspects of a method for kernel masking DRAM defects in the system of FIG. 1.

FIG. 4 is a data diagram illustrating an embodiment of a bad pages list for implementing certain aspects of a method for kernel masking DRAM defects in the system of FIG. 1.

DETAILED DESCRIPTION

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content" referred to herein, may also include files that are not executable in nature, such as documents that may need to be opened or other data files that need to be accessed.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

In this description, the terms "communication device," "wireless device," "wireless telephone", "wireless communication device," and "wireless handset" are used interchangeably. With the advent of third generation ("3G") wireless technology and four generation ("4G"), greater bandwidth availability has enabled more portable computing devices with a greater variety of wireless capabilities. Therefore, a portable computing device may include a cellular telephone, a pager, a PDA, a smartphone, a navigation device, or a hand-held computer with a wireless connection or link.

Figure 1:
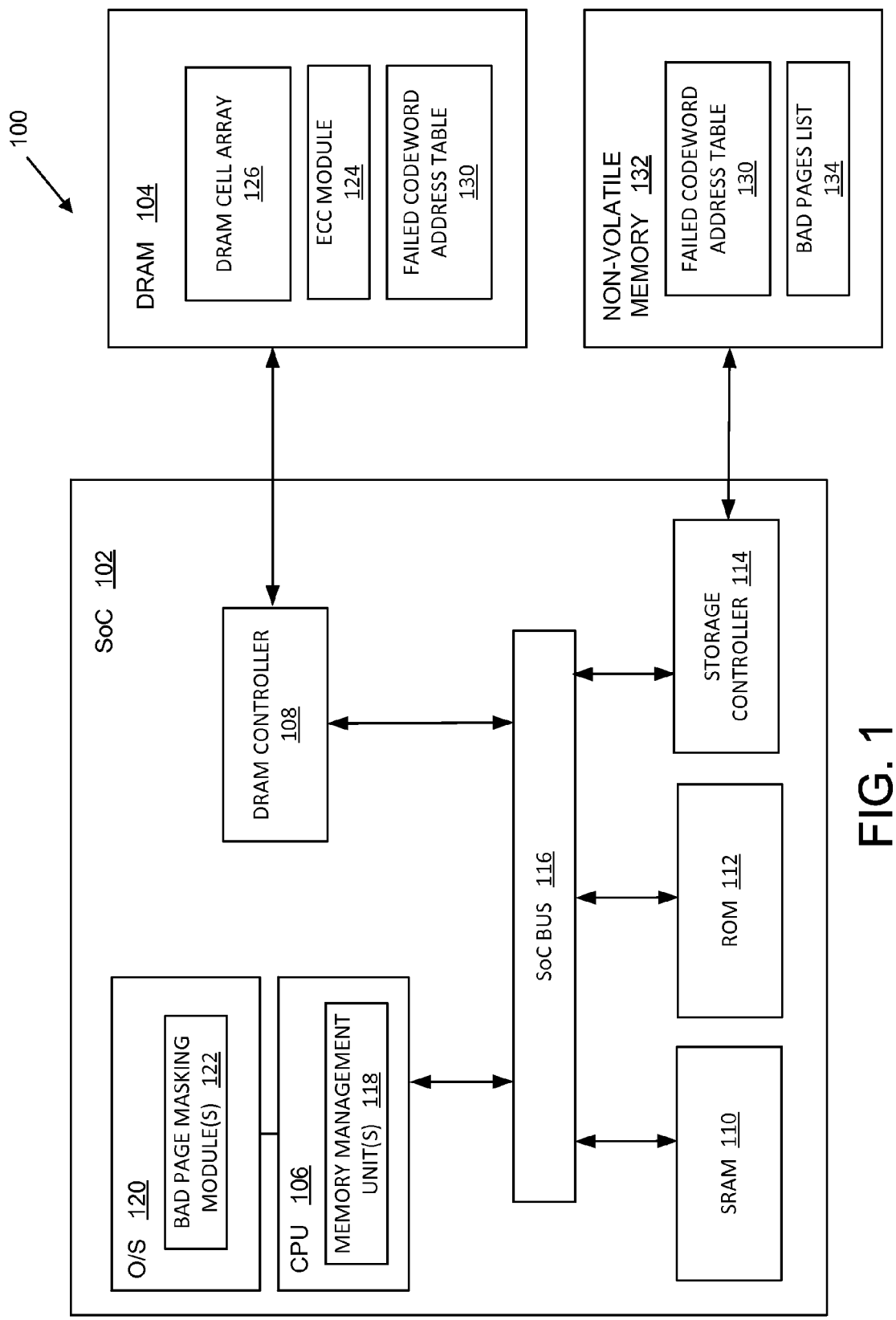
FIG. 1 is a block diagram of an embodiment of a system for providing kernel masking of DRAM defects.

FIG. 1 illustrates a system 100 that provides kernel masking of DRAM defects. The system 100 may be implemented in any computing device, including a personal computer, a workstation, a server, a portable computing device (PCD), such as a cellular telephone, a portable digital assistant (PDA), a portable game console, a palmtop computer, or a tablet computer. As illustrated in the embodiment of FIG. 1, the system 100 comprises a system on chip (SoC) 102 electrically coupled to a DRAM memory system 104 and a non-volatile memory 132. The non-volatile memory 132 may comprise any non-volatile memory, such as, for example, flash memory, flash drive, a Secure Digital (SD) card, a solid-state drive (SSD), or other types.

The SoC 102 comprises various on-chip components, including a central processing unit (CPU) 106, a DRAM controller 108, static random access memory (SRAM) 110, read only memory (ROM) 112, and a storage controller 114 interconnected via a SoC bus 116. The SoC 102 may include one or more memory clients that request memory resources from DRAM 104. The memory clients may comprise one or more processing units (e.g., central processing unit (CPU) 106, a graphics processing unit (GPU), a digital signal processor (DSP), etc.), a video encoder, or other clients requesting read/write access to DRAM system 104.

Storage controller 114 on SoC 102 is electrically coupled to non-volatile memory 132. Storage controller 114 manages the data stored on non-volatile memory 132. DRAM controller 108 is electrically coupled to DRAM 104 via, for example, a RAM bus. DRAM controller 108 manages the flow of data going to and from the DRAM 104. DRAM controller 108 generally comprises the logic for reading and writing to DRAM 104.

The system 100 allows an operating system (O/S) 120 to mask out defects or errors in the DRAM cell array 126 and, thereby, provide error-free virtual memory to the memory clients on the SoC 102. System 100 provides kernel masking of DRAM defects using an error correcting code (ECC) module 124 and bad page masking module(s) 122. ECC module 124 detects double-bit errors and corrects single-bit errors during DRAM operations (e.g., read and/or write operations). For example, during a DRAM write operation, the ECC module 124 may use the write data as input and then generate redundant parity check bits. The combined write data and parity check bits together form a unit known as a codeword and may be stored either separated or together in the DRAM cell array 126. During a read operation, the ECC module 124 may use the retrieved data portion of the codeword to recomputed the parity check bits and then compare these against the parity check bits portion of the codeword that was stored during the write operation. A mismatch between the read recomputed parity and the stored parity indicates a detected error. In addition, the parity check bits may be sufficient to provide single error correction within the codeword.

It should be appreciated that ECC module 124 may be integrated as a component in DRAM 104 (as shown in FIG. 1) or in SoC 102. Bad page masking module(s) 122 generally comprise logic for masking bad physical pages associated with failed codeword addresses. Bad page masking module(s) 122 interface with ECC module 124 for receiving error data associated with failed codeword addresses. One of ordinary skill in the art will appreciate that DRAM bit errors may have several underlying causes, such as, for example, latent silicon defect, particle or electromagnetic wave disruption of charge, or weak capacitor retention, any of which may result in a codeword error.

Figure 2:
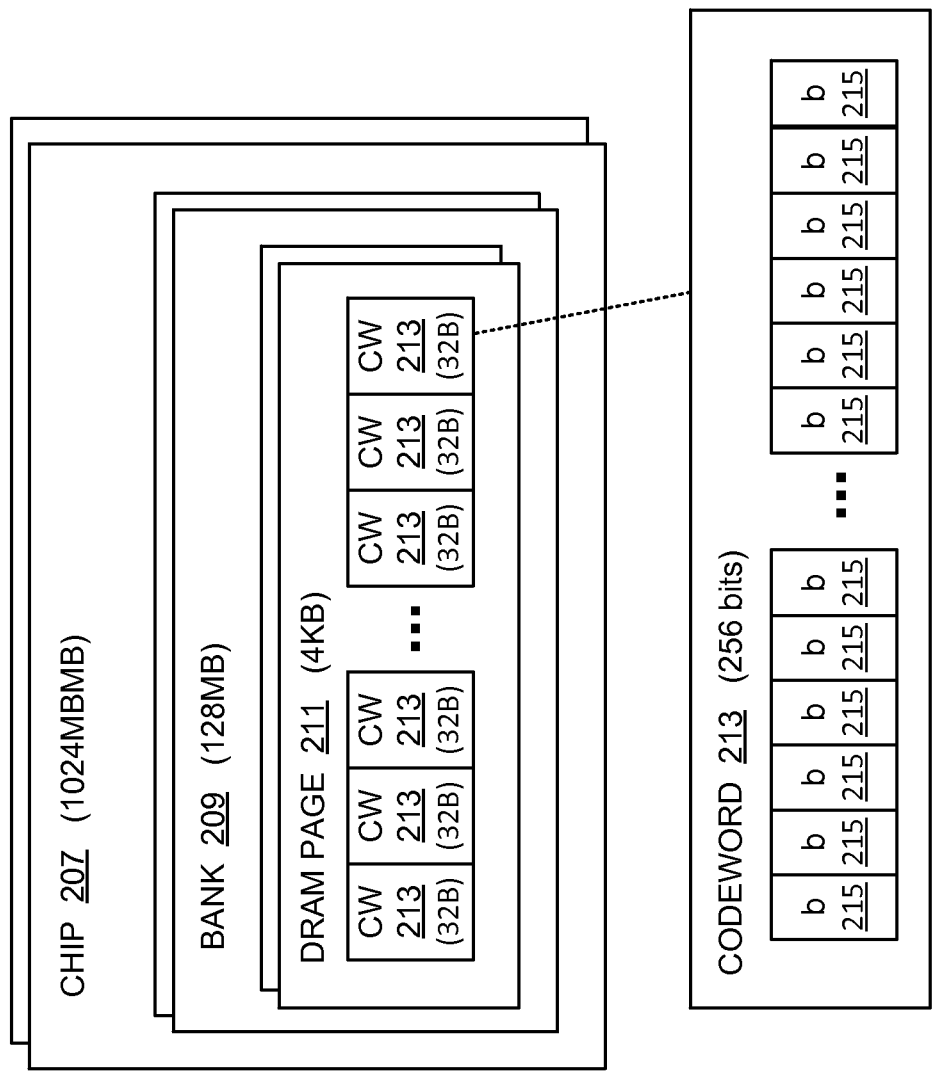
FIG. 2 is a block diagram illustrating a more detailed view of the physical architecture of an embodiment of the DRAM system in FIG. 1.

Referring to FIG. 2, the error data may comprise information identifying, for example, a DRAM chip 207, a bank 209 in a DRAM chip 207, a DRAM page 211 in one of the banks 209, and a codeword address corresponding to a codeword 213. FIG. 2 illustrates an exemplary embodiment of a DRAM system 104, which comprises one or more DRAM chips 207. As known in the art, each DRAM chip 207 may comprise a plurality of banks 209 with each bank 209 defining a plurality of DRAM pages 211. A DRAM page 211 comprises a plurality of codewords 213. A codeword 213 comprises a plurality of bits 215 in DRAM cell array 126. FIG. 2 shows a codeword 213 comprising 256 bits of data and corresponding to a physical address (0x00000DAD0).

As known in the art, in operation, ECC module 124 may detect and correct failed bits, thereby enabling a successful DRAM operation despite the failed bit. ECC module 124 may temporarily store the error data in, for example, a volatile register/RAM in the DRAM 104. The error data may comprise information pertaining to the ECC failure, such as, for example, the start address of the most recent failed codewords and whether the error was successfully corrected or not. The error data may not be directly addressable by SoC software but made available via DRAM controller 108 to query the DRAM 104 for the error data. Bad page masking module(s) 122, O/S 120, or other software (e.g., a virtual memory manager) running on CPU 106 reads the error data from the ECC module 124 revealing the failed codeword address 301 and stores this error data in a failed codeword address table 130 located in non-volatile memory 132. An error count 303 may keep track of a number of times that this failed codeword address 301 has encountered an error. As new locations have errors, the number of entries in the failed codeword address table 130 increases. As errors repeat for the same codeword address 301, the error count 303 increments.

FIG. 3 illustrates an exemplary embodiment of a failed codeword address table 130. Table 130 may comprise a data field 301 for listing the address corresponding to the failed codeword 213 (FIG. 2). A data field 303 includes an error count of accumulated errors for the failed codeword address. Bad page masking module(s) 122 may be configured to receive the error data from ECC module 124 and update the failed codeword address table 130, including incrementing the error count. It should be appreciated that the error count data field 303 enables bad page masking module(s) 122 to determine bad physical pages. For example, if the error count for a codeword address 213 exceeds a predetermined threshold, the physical location in DRAM 104 may be defined by O/S 120 as a bad physical page. If the threshold is exceeded, bad page masking module(s) 122 may retire the kernel page corresponding to the failed codeword address. If the page is currently in use, the virtual page may be reassigned to a new physical page and the content migrated to the new physical page.

Kernel pages may be retired via the generation and management of a bad pages list 134 stored in non-volatile memory 132. FIG. 4 illustrates an exemplary bad pages list 134, which identifies a kernel page start address (data field 305) containing the failed codeword address (field 307) that has exceeded the error count threshold. In the example of FIGS. 3 & 4, the error count threshold=2 errors, in which case the codeword address 0x00000DAD0 is identified as a failed codeword address. Bad pages list 134 may be updated to list the kernel page start address (0x00000D800) in data field 305 that holds the failed codeword address (0x00000DAD0).

As described below in more detail, when assigning physical pages to virtual memory, system 100 may access the bad pages list 134 to determine which pages are bad and exclude them from being allocated. For example, in a 1-Gigabyte DRAM chip 207 comprising $2^{30}$ bytes there are $2^{18}$ pages 211, each page having a size $2^{12}$ bytes (4096 bytes). Of these $2^{18}$ pages 211, there may be a fraction (e.g., approximately 0.01%) that have or will fail and must be removed from future use. Access to physical pages may be controlled from the operating system 120 and bad page masking module 122 using the same free page block lists, page tables, and MMU 118 as used for regular virtual-to-physical mapping. Kernel page start addresses 305 that have been found to be bad are removed from the operating system's free page block list. In this manner, virtual memory is never allocated using bad physical pages as defined in bad pages list 134.

Figure 5:
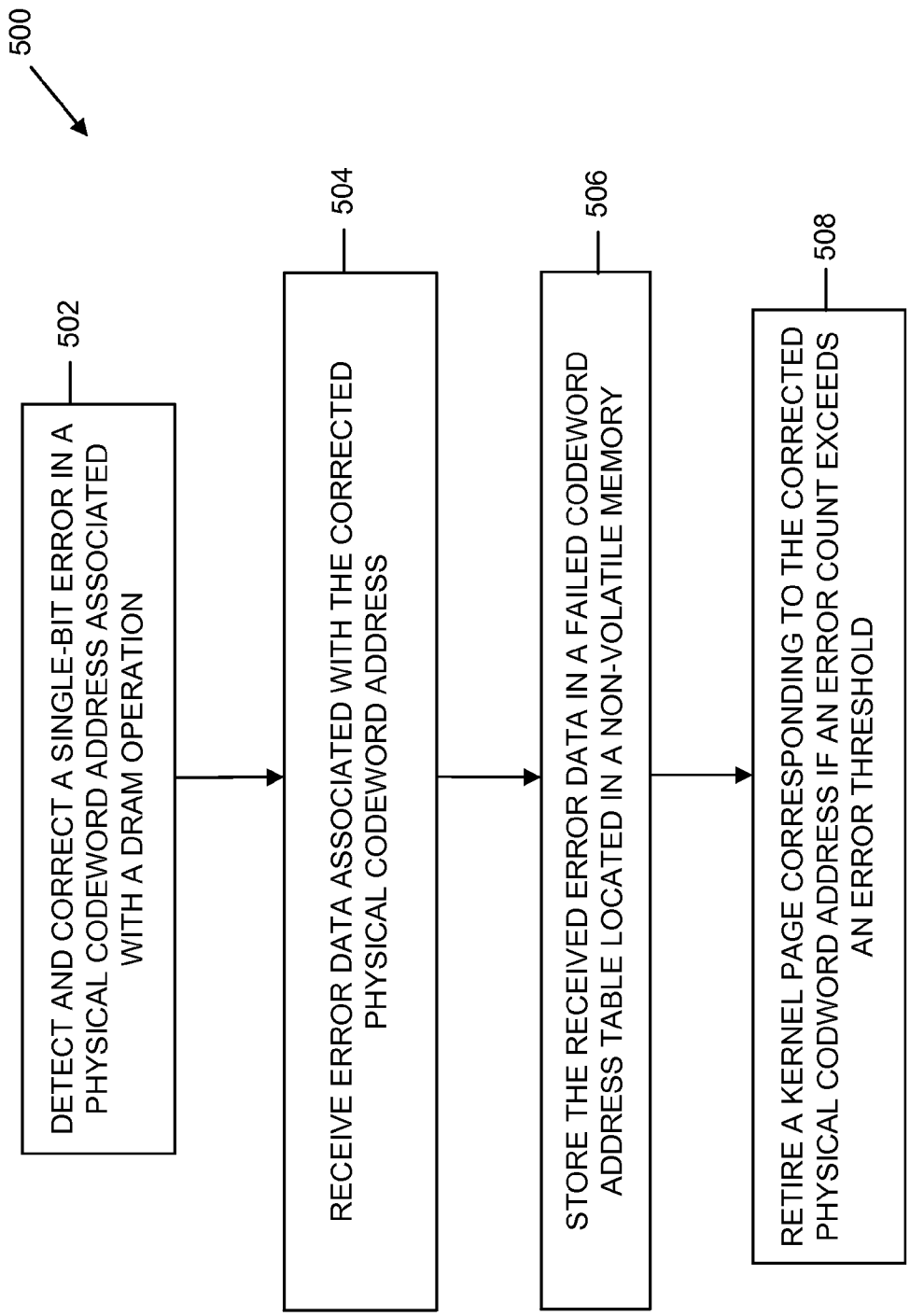
FIG. 5 is a flowchart illustrating an embodiment of a method implemented in the system of FIG. 1 for kernel masking DRAM defects.

FIG. 5 illustrates an embodiment of a method implemented in system 100 for kernel masking DRAM defects. At block 502, ECC module 124 detects and corrects single-bit errors in a codeword 213 associated with a DRAM operation. At block 504, error data associated with the failed codeword 213 may be received by O/S 120, bad page masking module 122, or other software. The error data may be stored (block 506) in a failed codeword address table 130 (FIG. 3) located in non-volatile memory 132 or otherwise updated to increment the error count (data field 303). As described above, if the error count exceeds the error count threshold, a kernel page corresponding to the failed codeword address 307 may be retired (block 508) and the physical DRAM location excluded from memory allocation.

Figure 9:
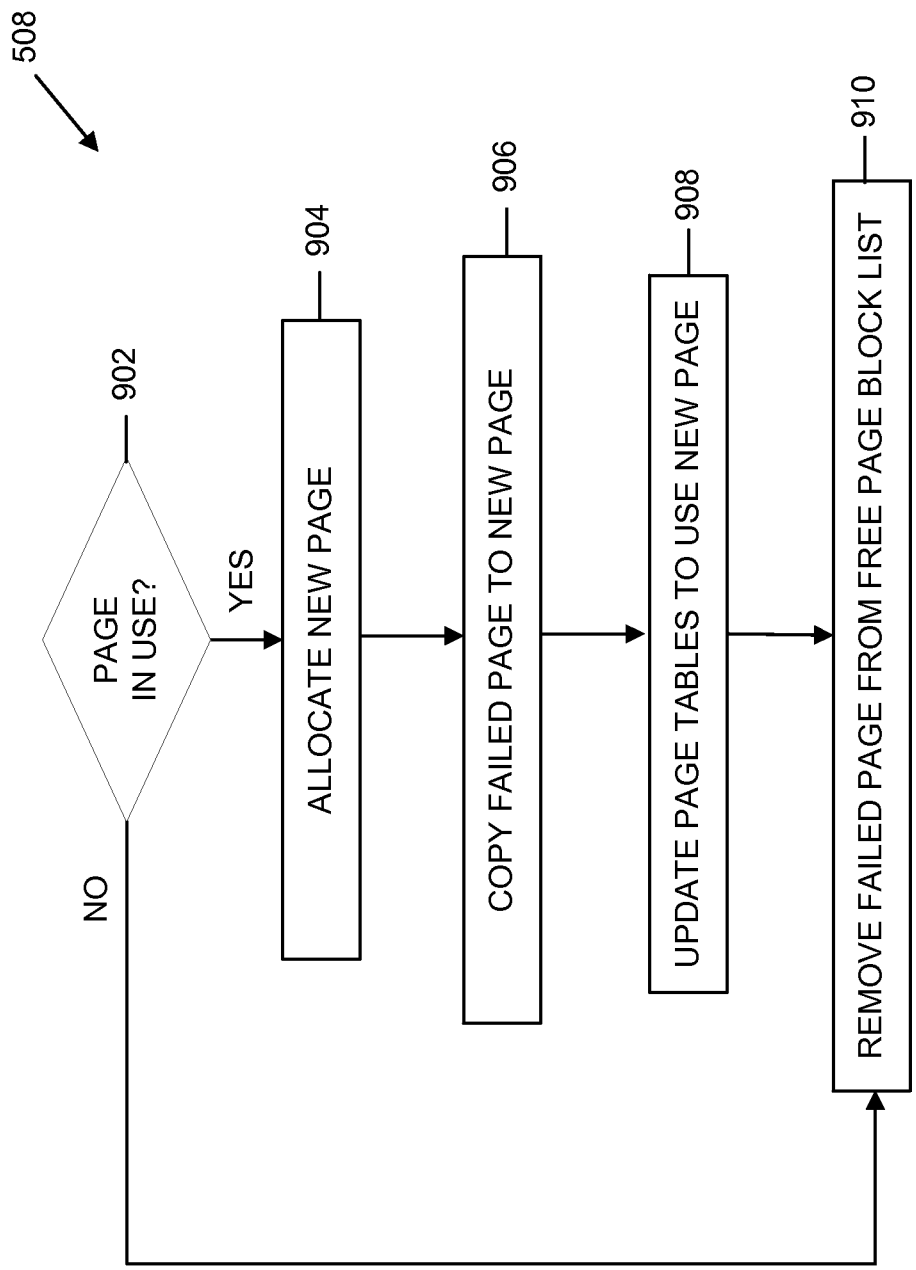
FIG. 9 is a flowchart illustrating an embodiment of a method for retiring a kernel page in the flowchart of FIG. 5.

FIG. 9 illustrates an embodiment of a method for implementing block 508 in FIG. 5 for retiring a kernel page. It should be appreciated that a kernel page may or may not be in use when it is determined to be retired. At block 902, the kernel page is checked whether it is in use or not by inspecting the operating system 120 page tables, which comprise a software structure that contains a directory of all of the mappings to physical memory. If the kernel page is in use, at block 904, a new empty page is allocated from the free page block list 122. The free page block list 122 comprises a software structure that contains a directory of all unused and therefore available physical memory. Using a previous example, a 1-Gigabyte DRAM chip 207 consisting of $2^{30}$ bytes contains $2^{18}$ pages. If half of the memory is free (i.e., available) for use, then the free page block list contains a directory of $2^{17}$ free pages. The operating system 120 consults the free page block list 122 whenever allocating memory. At block 906, the contents of the failed kernel page may be copied to the new empty page. At block 908, the page tables may be updated, switching the reference to the previous failed kernel page to the new empty page. At block 910, the failed kernel page is no longer allowed to exist on the free page block list 122.

Figure 6:
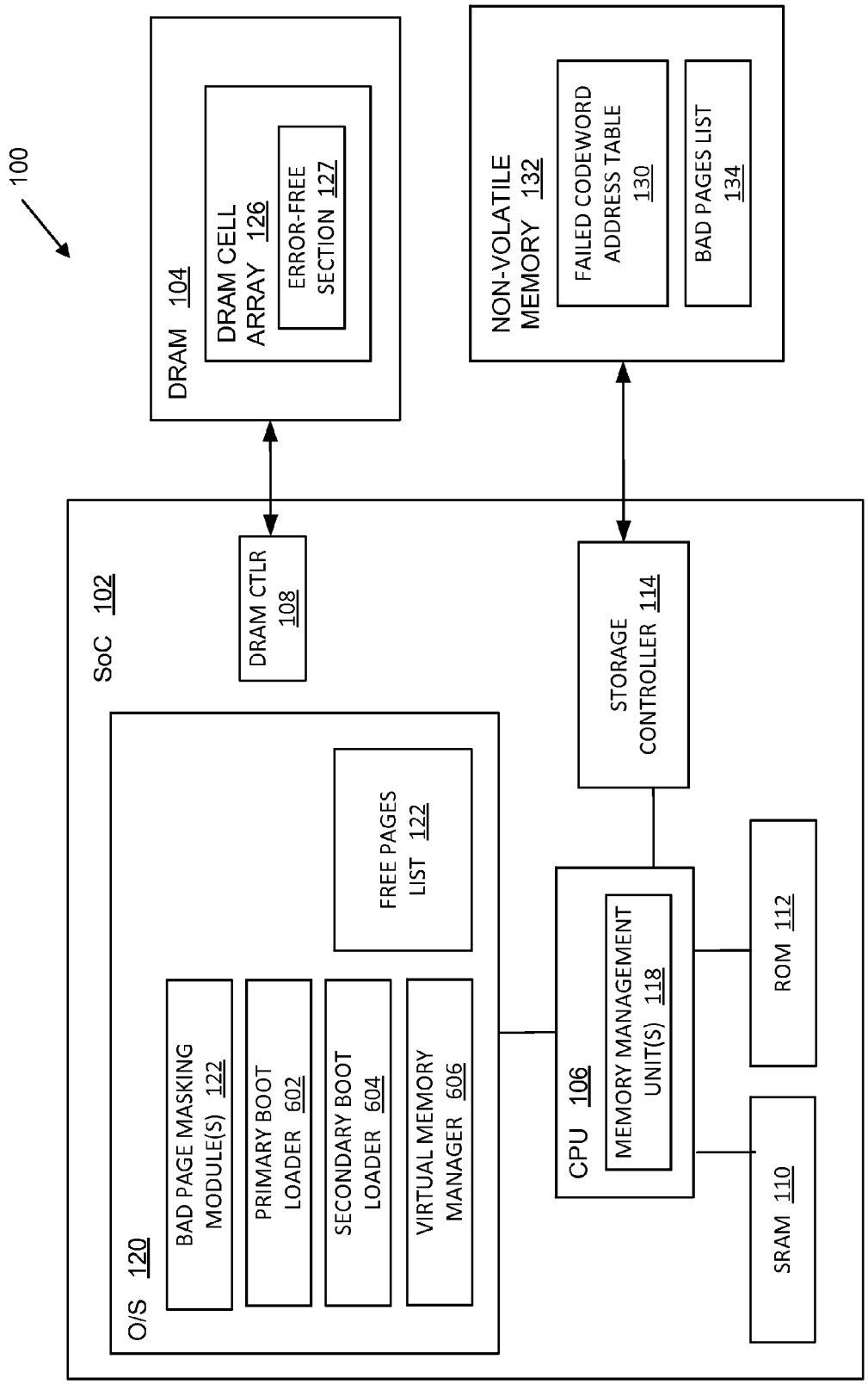
FIG. 6 is a block diagram illustrating another embodiment of a system for kernel masking DRAM defects.
Figure 7:
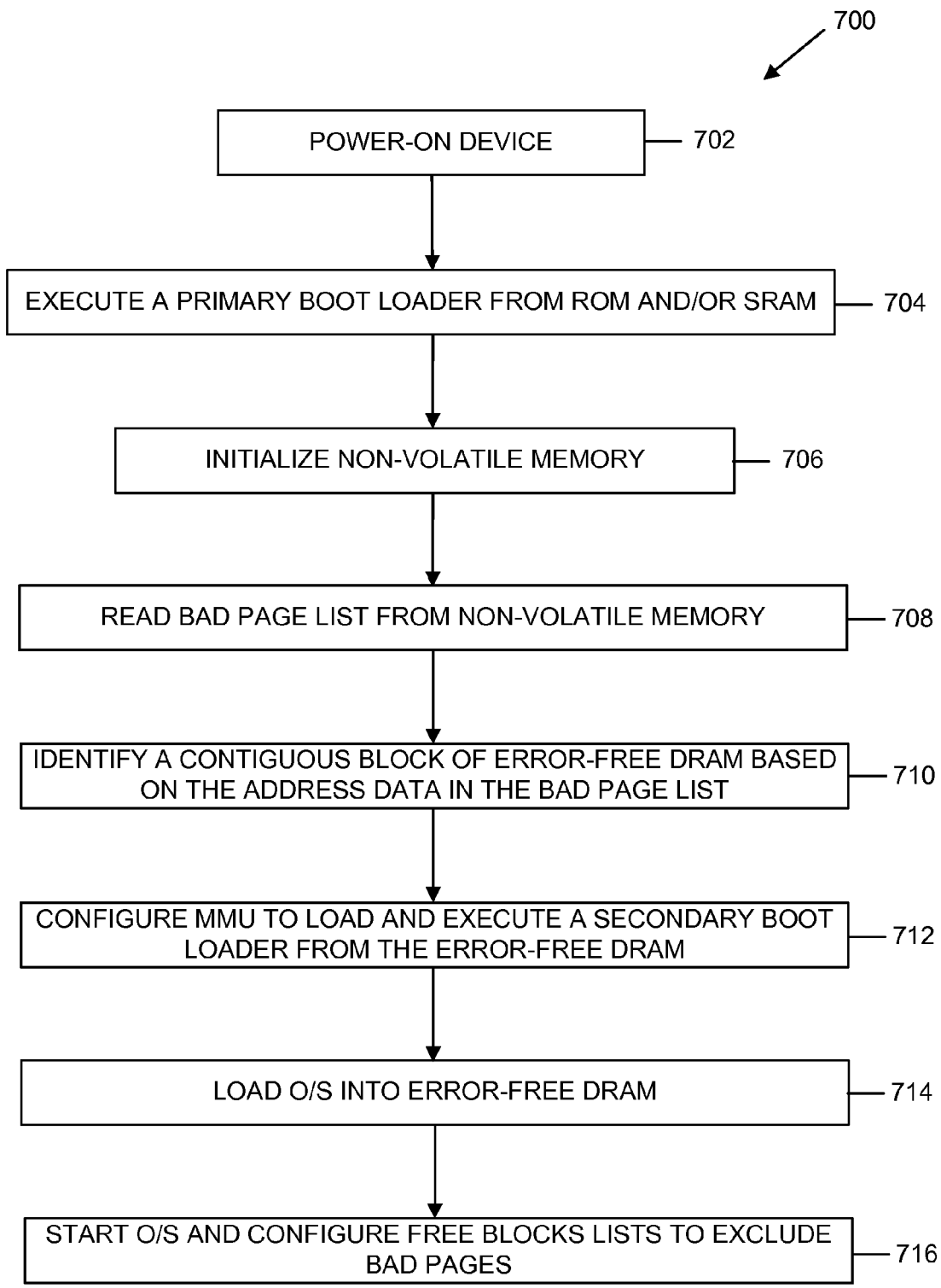
FIG. 7 is a flow chart illustrating an embodiment of a device boot-up method implemented in the system of FIG. 1 for kernel masking DRAM defects.

FIGS. 6 & 7 illustrate an exemplary implementation for retiring kernel pages based on bad pages list 134. As illustrated in FIG. 6, O/S 120 may further comprise a primary boot loader 602, a secondary boot loader 604, and a virtual memory manager 606. Virtual memory manager 606 may comprise a memory allocation component for generating and managing a free page block list 122 for identifying error-free DRAM memory.

Primary boot loader 602 does not execute from or use any DRAM. Rather, it runs from SRAM 110 and/or ROM 112. Secondary boot loader 604 accesses bad pages list 134 and retrieves the list of bad physical pages from non-volatile memory 132. Using the list of bad physical pages, secondary boot loader 604 locates a contiguous section of DRAM addresses (which contain zero bad pages) and configures MMU 118 to use this section as error-free main memory 127 (FIG. 6) for secondary boot operations, such as, for example, loading software mages. The error-free section 127 may be of arbitrary size and may be formed using a single or multiple smaller contiguous sections. The error-free section 127 may be located anywhere in DRAM cell array 126. Alternatively, a predetermined area of DRAM 104 may be guaranteed error free by operating this portion with a high-rate refresh.

Secondary boot loader 604 loads O/S 120 into the error-free section and also passes the bad physical page info along to other system components. O/S 120 starts virtual memory manager 606, which can use the bad physical page data to access the entire memory space. At this point, all bad physical pages have been marked as "don't use" and are never allocated for use. The kernel can relocate to another physical location if needed. All memory clients may communicate with O/S 120 to obtain error-free DRAM.

FIG. 7 illustrates an embodiment of a method implemented by the system 100 (FIG. 6) for kernel masking DRAM defects. At block 702, a device incorporating system 100 (e.g., PCD 800) is powered on and a boot sequence is initiated. As known in the art, the boot sequence may be initiated by a basic input/output system (BIOS), O/S 120, or CPU 106. At block 704, primary boot loader 602 is executed by CPU 106 from, for example, ROM 112 and/or SRAM 110. Non-volatile memory 132 is initialized (block 706) and bad page list 134 is read (block 708). At block 710, a contiguous block of error-free DRAM is identified based on the address data in bad page list 134. MMU 118 is configured to load and execute secondary boot loader 604 from the error-free section 127 (block 712). At block 714, O/S 120 may be loaded into the error-free section 127. At block 716, O/S 120 starts and configures a free page block list 122 to exclude the bad physical pages identified in bad pages list 134.

Figure 8:
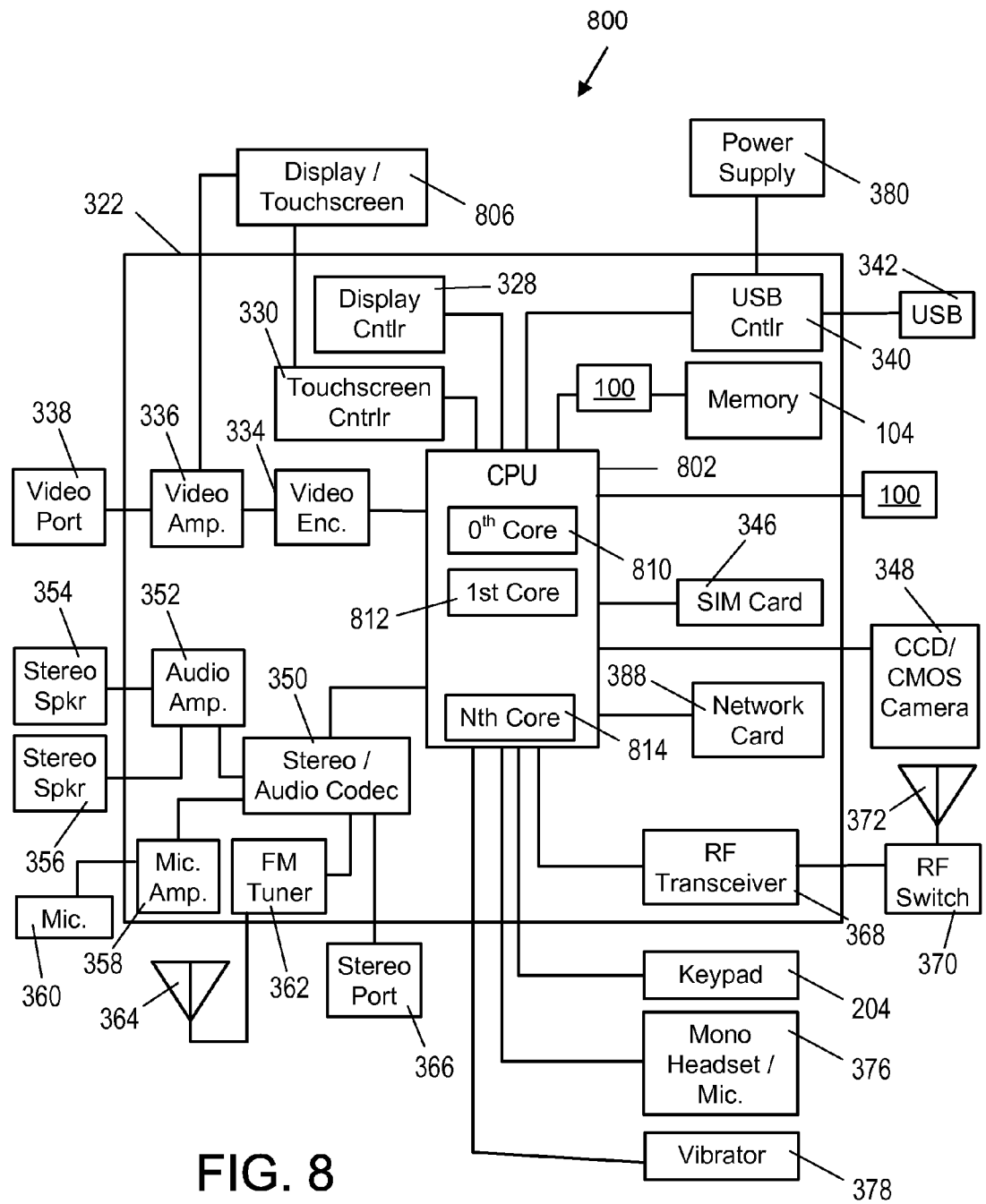
FIG. 8 is a block diagram of an embodiment of a portable computer device comprising the system of FIG. 1.

As mentioned above, the system 100 may be incorporated into any desirable computing system. FIG. 8 illustrates the system 100 incorporated in an exemplary portable computing device (PCD) 800. It will be readily appreciated that certain components of the system 100 are included on the SoC 322 (FIG. 8) while other components (e.g., the DRAM 104) are external components coupled to the SoC 322. The SoC 322 may include a multicore CPU 802. The multicore CPU 802 may include a zeroth core 810, a first core 812, and an Nth core 814. One of the cores may comprise, for example, a graphics processing unit (GPU) with one or more of the others comprising the CPU.

A display controller 328 and a touch screen controller 330 may be coupled to the CPU 802. In turn, the touch screen display 806 external to the on-chip system 322 may be coupled to the display controller 328 and the touch screen controller 330.

FIG. 8 further shows that a video encoder 334, e.g., a phase alternating line (PAL) encoder, a sequential color a memoire (SECAM) encoder, or a national television system(s) committee (NTSC) encoder, is coupled to the multicore CPU 602. Further, a video amplifier 336 is coupled to the video encoder 334 and the touch screen display 806. Also, a video port 338 is coupled to the video amplifier 336. As shown in FIG. 8, a universal serial bus (USB) controller 340 is coupled to the multicore CPU 802. Also, a USB port 342 is coupled to the USB controller 340. Memory 104 and a subscriber identity module (SIM) card 346 may also be coupled to the multicore CPU 802. Memory 104 may reside on the SoC 322 or be coupled to the SoC 322 (as illustrated in FIG. 1). The memory 104 may comprise a DRAM memory system (FIG. 1) as described above.

Further, as shown in FIG. 8, a digital camera 348 may be coupled to the multicore CPU 802. In an exemplary aspect, the digital camera 348 is a charge-coupled device (CCD) camera or a complementary metal-oxide semiconductor (CMOS) camera.

As further illustrated in FIG. 8, a stereo audio coder-decoder (CODEC) 350 may be coupled to the multicore CPU 802. Moreover, an audio amplifier 352 may coupled to the stereo audio CODEC 350. In an exemplary aspect, a first stereo speaker 354 and a second stereo speaker 356 are coupled to the audio amplifier 352. FIG. 8 shows that a microphone amplifier 358 may be also coupled to the stereo audio CODEC 350. Additionally, a microphone 360 may be coupled to the microphone amplifier 358. In a particular aspect, a frequency modulation (FM) radio tuner 362 may be coupled to the stereo audio CODEC 350. Also, an FM antenna 364 is coupled to the FM radio tuner 362. Further, stereo headphones 366 may be coupled to the stereo audio CODEC 350.

FIG. 8 further illustrates that a radio frequency (RF) transceiver 368 may be coupled to the multicore CPU 802. An RF switch 370 may be coupled to the RF transceiver 368 and an RF antenna 372. A keypad 204 may be coupled to the multicore CPU 802. Also, a mono headset with a microphone 376 may be coupled to the multicore CPU 602. Further, a vibrator device 378 may be coupled to the multicore CPU 802.

FIG. 8 also shows that a power supply 380 may be coupled to the on-chip system 322. In a particular aspect, the power supply 380 is a direct current (DC) power supply that provides power to the various components of the PCD 800 that require power. Further, in a particular aspect, the power supply is a rechargeable DC battery or a DC power supply that is derived from an alternating current (AC) to DC transformer that is connected to an AC power source.

FIG. 8 further indicates that the PCD 800 may also include a network card 388 that may be used to access a data network, e.g., a local area network, a personal area network, or any other network. The network card 388 may be a Bluetooth network card, a WiFi network card, a personal area network (PAN) card, a personal area network ultra-low-power technology (PeANUT) network card, a television/cable/satellite tuner, or any other network card well known in the art. Further, the network card 388 may be incorporated into a chip, i.e., the network card 388 may be a full solution in a chip, and may not be a separate network card 388.

As depicted in FIG. 8, the touch screen display 806, the video port 338, the USB port 342, the camera 348, the first stereo speaker 354, the second stereo speaker 356, the microphone 360, the FM antenna 364, the stereo headphones 366, the RF switch 370, the RF antenna 372, the keypad 374, the mono headset 376, the vibrator 378, and the power supply 380 may be external to the on-chip system 322.

It should be appreciated that one or more of the method steps described herein may be stored in the memory as computer program instructions, such as the modules described above. These instructions may be executed by any suitable processor in combination or in concert with the corresponding module to perform the methods described herein.

Certain steps in the processes or process flows described in this specification naturally precede others for the invention to function as described. However, the invention is not limited to the order of the steps described if such order or sequence does not alter the functionality of the invention. That is, it is recognized that some steps may performed before, after, or parallel (substantially simultaneously with) other steps without departing from the scope and spirit of the invention. In some instances, certain steps may be omitted or not performed without departing from the invention. Further, words such as "thereafter", "then", "next", etc. are not intended to limit the order of the steps. These words are simply used to guide the reader through the description of the exemplary method.

Additionally, one of ordinary skill in programming is able to write computer code or identify appropriate hardware and/or circuits to implement the disclosed invention without difficulty based on the flow charts and associated description in this specification, for example.

Therefore, disclosure of a particular set of program code instructions or detailed hardware devices is not considered necessary for an adequate understanding of how to make and use the invention. The inventive functionality of the claimed computer implemented processes is explained in more detail in the above description and in conjunction with the Figures which may illustrate various process flows.

In one or more exemplary aspects, the functions described may be implemented in hardware, software, firmware, or any combination thereof. If implemented in software, the functions may be stored on or transmitted as one or more instructions or code on a computer-readable medium. Computer-readable media include both computer storage media and communication media including any medium that facilitates transfer of a computer program from one place to another. A storage media may be any available media that may be accessed by a computer. By way of example, and not limitation, such computer-readable media may comprise RAM, ROM, EEPROM, NAND flash, NOR flash, M-RAM, P-RAM, R-RAM, CD-ROM or other optical disk storage, magnetic disk storage or other magnetic storage devices, or any other medium that may be used to carry or store desired program code in the form of instructions or data structures and that may be accessed by a computer.

Also, any connection is properly termed a computer-readable medium. For example, if the software is transmitted from a website, server, or other remote source using a coaxial cable, fiber optic cable, twisted pair, digital subscriber line ("DSL"), or wireless technologies such as infrared, radio, and microwave, then the coaxial cable, fiber optic cable, twisted pair, DSL, or wireless technologies such as infrared, radio, and microwave are included in the definition of medium.

Disk and disc, as used herein, includes compact disc ("CD"), laser disc, optical disc, digital versatile disc ("DVD"), floppy disk and blu-ray disc where disks usually reproduce data magnetically, while discs reproduce data optically with lasers. Combinations of the above should also be included within the scope of computer-readable media.

Alternative embodiments will become apparent to one of ordinary skill in the art to which the invention pertains without departing from its spirit and scope. Therefore, although selected aspects have been illustrated and described in detail, it will be understood that various substitutions and alterations may be made therein without departing from the spirit and scope of the present invention, as defined by the following claims.

What is claimed is:

1. A method for kernel masking dynamic random access memory (DRAM) defects, the method comprising:
detecting and correcting a single-bit error associated with a physical address in a dynamic random access memory (DRAM);
receiving error data associated with the physical address from the DRAM;
storing the received error data in a failed address table located in a non-volatile memory; and
retiring a kernel page corresponding to the physical address if a number of errors associated with the physical address exceeds an error count threshold;
wherein the retiring the kernel page corresponding to the physical address comprises:
generating and storing a bad pages list in the non-volatile memory, the bad pages list identifying a kernel page holding the physical address which is to be excluded from memory allocation.

2. The method of claim 1, wherein the single-bit error is detected and corrected by the DRAM.

3. The method of claim 1, wherein receiving the error data associated with the physical address from the DRAM comprises: an operating system querying the DRAM for error data.

4. The method of claim 1, wherein the received error data identifies a DRAM bank, column, and row address corresponding to a failed codeword address.

5. The method of claim 4, wherein the storing the received error data in the failed address table comprises: updating the number of errors associated with the failed codeword address.

6. The method of claim 1, further comprising:
transferring content of the kernel page to a new empty kernel page; and
removing the kernel page from future use.

7. The method of claim 1, further comprising:
at a device boot-up, reading the bad pages list stored in the non-volatile memory; and
excluding the kernel page identified in the bad pages list from an operating system free page block list.

8. The method of claim 1, further comprising:
executing, at a device boot-up, a primary boot loader from a memory other than the DRAM and the non-volatile memory;
reading the bad pages list from the non-volatile memory; and
determining a contiguous block of error-free DRAM by excluding one or more kernel pages identified in the bad pages list.

9. The method of claim 8, further comprising:
executing a secondary boot loader from the error-free DRAM;
loading an operating system from the error-free DRAM;
the operating system configuring a free blocks list that excludes the kernel page identified in the bad pages list.

10. The method of claim 1, wherein the retiring the kernel page corresponding to the physical address comprises: excluding the kernel page from allocated DRAM.

11. A system for kernel masking dynamic random access memory (DRAM) defects, the system comprising:
means for detecting and correcting a single-bit error associated with a physical address in a dynamic random access memory (DRAM);
means for receiving error data associated with the physical address from the DRAM;
means for storing the received error data in a failed address table located in a non-volatile memory; and
means for retiring a kernel page corresponding to the physical address if a number of errors associated with the physical address exceeds an error count threshold, wherein the means for retiring the kernel page corresponding to the physical address comprises:
means for generating and storing a bad pages list in the non-volatile memory, the bad pages list identifying a kernel page holding the physical address which is to be excluded from memory allocation.

12. The system of claim 11, wherein the means for receiving the error data from the DRAM comprises: means for querying the DRAM for error data.

13. The system of claim 11, wherein the received error data identifies a DRAM bank, column, and row address corresponding to a failed codeword address.

14. The system of claim 13, wherein the means for storing the received error data in the failed address table comprises: means for updating the number of errors associated with the failed codeword address.

15. The system of claim 11, further comprising:
means for reading, at a device boot-up, the bad pages list stored in the non-volatile memory; and
means for excluding the kernel page identified in the bad pages list from an operating system free page block list.

16. The system of claim 11, further comprising:
means for executing, at a device boot-up, a primary boot loader from a memory other than the DRAM and the non-volatile memory;
means for reading the bad pages list from the non-volatile memory; and
means for determining a contiguous block of error-free DRAM by excluding one or more kernel pages identified in the bad pages list.

17. The system of claim 11, further comprising:
means for executing a secondary boot loader from the error-free DRAM;
means for loading an operating system from the error-free DRAM;
means for configuring an operating system free blocks list that excludes the kernel page identified in the bad pages list.

18. The system of claim 11, wherein the retiring the kernel page corresponding to the physical address comprises: excluding the kernel page from allocated DRAM.

19. A computer program embodied in a non-transitory computer readable medium and executable by a processor for kernel masking dynamic random access memory (DRAM) defects, the computer program comprising logic configured to:
detect and correct a single-bit error associated with a physical address in a dynamic random access memory (DRAM);
receive error data associated with the physical address from the DRAM;
store the received error data in a failed address table located in a non-volatile memory; and
retire a kernel page corresponding to the physical address if a number of errors associated with the physical address exceeds an error count threshold, wherein the logic configured to retire the kernel page corresponding to the physical address comprises: logic configured to generate and store a bad pages list in the non-volatile memory, the bad pages list identifying a kernel page holding the physical address which is to be excluded from memory allocation.

20. The computer program of claim 19, wherein the single-bit error is detected and corrected by the DRAM.

21. The computer program of claim 19, wherein the logic configured to receive the error data from the DRAM comprises: logic configured to query the DRAM for error data.

22. The computer program of claim 19, wherein the received error data identifies a DRAM bank, column, and row address corresponding to a failed codeword address.

23. The computer program of claim 22, wherein the logic configured to store the received error data in the failed address table comprises: logic configured to update the number of errors associated with the failed codeword address.

24. The computer program of claim 19, further comprising:
logic configured to read, at a device boot-up, the bad pages list stored in the non-volatile memory; and
logic configured to exclude the kernel page identified in the bad pages list from an operating system free page block list.

25. The computer program of claim 19, further comprising:
logic configured to execute, at a device boot-up, a primary boot loader from a memory other than the DRAM and the non-volatile memory;
logic configured to read the bad pages list from the non-volatile memory; and
logic configured to identify a contiguous block of error-free DRAM by excluding one or more kernel pages identified in the bad pages list.

26. The computer program of claim 25, further comprising:
logic configured to execute a secondary boot loader from the error-free DRAM;
logic configured to load an operating system from the error-free DRAM;
logic configured to generate a free blocks list that excludes the kernel page identified in the bad pages list.

27. The computer program of claim 19, wherein the logic configured to retire the kernel page corresponding to the physical address comprises: logic configured to exclude the kernel page from allocated DRAM.

28. A system for masking dynamic random access memory (DRAM) defects, the system comprising:
a dynamic random access memory (DRAM) system;
an error correcting code (ECC) module for detecting and correcting bit errors associated with failed codeword addresses in the DRAM system; and
a central processing unit (CPU) executing an operating system comprising a bad page masking module, the bad page masking module comprising logic configured to:
receive, via one or more of the DRAM system and the ECC module, error data associated with the failed codeword addresses;
store the received error data in a failed codeword address table located in a non-volatile memory; and
retire kernel pages corresponding to a failed codeword address if a number of errors associated with a respective failed codeword address exceeds an error count threshold, wherein the logic configured to retire the kernel page corresponding to the failed codeword address comprises: logic configured to generate and store a bad pages list in the non-volatile memory, the bad pages list identifying a kernel page holding the failed codeword address.

29. The system of claim 28, wherein the ECC module resides in the DRAM system, and the CPU resides on a system on chip (SoC) electrically coupled to the DRAM system.

30. The system of claim 28, wherein the logic configured to receive, via one or more of the DRAM system and the ECC module, the error data comprises: logic configured to query the DRAM system for error data.

31. The system of claim 28, wherein the logic configured to store the received error data in the failed codeword address table comprises: logic configured to update the number of errors associated with a failed codeword address.

32. The system of claim 28, further comprising:
logic configured to read, at a device boot-up, the bad pages list stored in the non-volatile memory; and
logic configured to exclude the kernel page identified in the bad pages list from an operating system free page block list.

33. The system of claim 28, further comprising:
logic configured to execute, at a device boot-up, a primary boot loader from one of a read only memory (ROM) and a static random access memory (SRAM);
logic configured to read the bad pages list from the non-volatile memory; and
logic configured to identify a contiguous block of error-free DRAM by excluding the kernel pages identified in the bad pages list.

34. The system of claim 33, further comprising:
logic configured to execute a secondary boot loader from the error-free DRAM;
logic configured to load an operating system from the error-free DRAM;
logic configured to generate a free blocks list that excludes the kernel page identified in the bad pages list.

35. The system of claim 28, wherein the logic configured to retire the kernel pages corresponding to the respective failed codeword addresses comprises: logic configured to exclude the kernel pages identified in the bad pages list from allocated DRAM.

36. The system of claim 28, embodied in a portable computing device.

* * * * *